United States Patent
Kim et al.

(10) Patent No.: US 9,893,221 B2
(45) Date of Patent: Feb. 13, 2018

(54) SOLAR CELL AND METHOD OF FABRICATING THE SAME

(71) Applicant: LG INNOTEK CO., LTD., Seoul (KR)

(72) Inventors: Kyung Am Kim, Seoul (KR); Jung Shik Baik, Seoul (KR); Ho Gun Cho, Seoul (KR); Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 12 days.

(21) Appl. No.: 14/522,073

(22) Filed: Oct. 23, 2014

(65) Prior Publication Data

US 2015/0040962 A1   Feb. 12, 2015

Related U.S. Application Data

(63) Continuation of application No. 13/262,441, filed as application No. PCT/KR2010/001989 on Mar. 31, 2010.

(30) Foreign Application Priority Data

Mar. 31, 2009  (KR) .................. 10-2009-0027874
Mar. 31, 2009  (KR) .................. 10-2009-0027875

(51) Int. Cl.
*H01L 31/05*  (2014.01)
*H01L 31/0749*  (2012.01)
(Continued)

(52) U.S. Cl.
CPC ...... *H01L 31/05* (2013.01); *H01L 31/022425* (2013.01); *H01L 31/046* (2014.12);
(Continued)

(58) Field of Classification Search
CPC ............ H01L 31/0749; H01L 31/0475; H01L 31/022425; H01L 31/05; H01L 31/046; Y02E 10/541; Y02P 70/521
See application file for complete search history.

(56) References Cited

U.S. PATENT DOCUMENTS 4,668,840 A   5/1987  Kiyama et al.
4,754,544 A   7/1988  Hanak
(Continued)

FOREIGN PATENT DOCUMENTS

CN   1158011 A   8/1997
CN   101048875 A   10/2007
(Continued)

OTHER PUBLICATIONS

JP05075155 A, Machine Translation, Inoue, Mar. 1993.*
(Continued)

*Primary Examiner* — Devina Pillay
(74) *Attorney, Agent, or Firm* — Saliwanchik, Lloyd & Eisenschenk

(57) ABSTRACT

A solar cell according to the embodiment includes a plurality of back electrode patterns spaced apart from each other on a substrate; a light absorption layer including contact patterns to connect electrodes to each other and division patterns to divide cells into unit cells on the substrate formed with the back electrode patterns; top electrode patterns spaced apart from each other by the division patterns on the light absorption layer; and insulating patterns among the back electrode patterns or on the back electrode patterns. The top electrode patterns are filled in the contact patterns and electrically connected to the back electrode patterns.

9 Claims, 7 Drawing Sheets

(51) Int. Cl.
*H01L 31/0475* (2014.01)
*H01L 31/046* (2014.01)
*H01L 31/0224* (2006.01)

(52) U.S. Cl.
CPC ...... *H01L 31/0475* (2014.12); *H01L 31/0749* (2013.01); *Y02E 10/541* (2013.01); *Y02P 70/521* (2015.11)

(56) References Cited

U.S. PATENT DOCUMENTS

| | | | |
|---|---|---|---|
| 4,929,281 | A | 5/1990 | Worner |
| 5,385,848 | A | 1/1995 | Grimmer |
| 5,641,362 | A | 6/1997 | Meier |
| 5,821,597 | A | 10/1998 | Nakajima et al. |
| 2003/0041893 | A1* | 3/2003 | Shimakawa .... H01L 31/022425 136/244 |
| 2003/0172967 | A1 | 9/2003 | Tachibana et al. |
| 2003/0180983 | A1* | 9/2003 | Oswald ................ H01L 31/18 438/57 |
| 2005/0076945 | A1 | 4/2005 | Tachibana et al. |
| 2005/0284518 | A1 | 12/2005 | Yamada et al. |
| 2006/0249196 | A1 | 11/2006 | Shima |
| 2007/0238285 | A1* | 10/2007 | Borden ............... H01L 31/0463 438/618 |
| 2008/0035198 | A1 | 2/2008 | Teppe et al. |
| 2008/0072956 | A1 | 3/2008 | Sharma et al. |
| 2008/0257399 | A1 | 10/2008 | Wong et al. |
| 2009/0056801 | A1* | 3/2009 | Chun-Hsiung . H01L 31/022425 136/256 |
| 2011/0250709 | A1 | 10/2011 | Tachibana et al. |

FOREIGN PATENT DOCUMENTS

| | | | | |
|---|---|---|---|---|
| JP | 56-107564 | | 8/1981 | |
| JP | 02-001992 | A | 1/1990 | |
| JP | H-03-091972 | A | 4/1991 | |
| JP | 05075155 | A * | 3/1993 | ............ H01L 31/04 |
| JP | H05-075155 | | 3/1993 | |
| JP | H06-45628 | A | 2/1994 | |
| JP | 07-086623 | A | 3/1995 | |
| JP | 08-51229 | | 2/1996 | |
| JP | 11-224956 | A | 8/1999 | |
| JP | 2001-358352 | | 12/2001 | |
| JP | 2001-358352 | A * | 12/2001 | ............ H01L 31/04 |
| JP | 2004-146435 | A | 5/2004 | |
| JP | 2005-260107 | A | 9/2005 | |
| JP | 2006-019715 | A | 1/2006 | |
| KR | 10-2007-0004593 | A | 1/2007 | |
| WO | WO-2009-020073 | A1 | 2/2009 | |

OTHER PUBLICATIONS

JP2001-358352A, Machine Translation, Dec. 2001, Hayakawa.*
Dhere, "Toward GW/year of CIGS production within the next decade", Solar Energy Materials & Solar Cells 91 (2007) 1376-1382, Jun. 2007.*
Office Action dated Dec. 1, 2015 in U.S. Appl. No. 13/262,441.
International Search Report in International Application No. PCT/KR2010/001989, filed Mar. 31, 2010.
Notice of Allowance dated Aug. 22, 2011 in Korean Application No. 10-2009-0027874, filed Mar. 31, 2009.
Office Action dated Jun. 3, 2011 in Korean Application No. 10-2009-0027875, filed Mar. 31, 2009.
Supplementary European Search Report dated Jul. 18, 2013 in European Application No. 10759038.2, filed Mar. 31, 2010.
Office Action dated Sep. 30, 2013 in Chinese Application No. 201080023778.4, filed Mar. 31, 2010.
Office Action dated Nov. 12, 2013 in Japanese Application No. 2012-503332, filed Mar. 31, 2010.
Office Action dated Mar. 4, 2014 in Japanese Application No. 2012-503332.
Japanese Office Action dated Oct. 6, 2015 in Japanese application No. 2002-306919 filed Oct. 22, 2002.
Final Office Action dated Jul. 29, 2015 in U.S. Appl. No. 13/262,441.
Office Action dated Feb. 3, 2015 in Japanese Application No. 2014-021025.
Office Action dated Aug. 25, 2016 in U.S. Appl. No. 13/262,441.
Office Action dated Dec. 21, 2016 in U.S. Appl. No. 13/262,441.

* cited by examiner

SOLAR CELL AND METHOD OF FABRICATING THE SAME

CROSS-REFERENCE TO RELATED APPLICATIONS

This application is a continuation of U.S. application Ser. No. 13/262,441, filed Sep. 30, 2011, which is the U.S. national stage application of International Patent Application No. PCT/KR2010/001989, filed Mar. 31, 2010, which claims priority to Korean Application Nos. 10-2009-0027874, filed Mar. 31, 2009, and 10-2009-0027875, filed Mar. 31, 2009, the disclosures of each of which are incorporated herein by reference in their entirety.

TECHNICAL FIELD

The disclosure relates to a solar cell and a method of fabricating the same.

BACKGROUND ART

Recently, as energy consumption has been increased, a solar cell capable of converting solar energy into electric energy has been developed.

In particular, a CIGS solar cell, which is a PN hetero junction device having a substrate structure including a glass substrate, a metal back electrode layer, a P type CIGS light absorption layer, a high-resistance buffer layer, and an N type window layer, is extensively used.

In addition, in order to fabricate such a solar cell, a mechanical patterning process may be performed. However, if the mechanical patterning is performed, the precision degree may be lowered and the defect may occur during the patterning process.

DISCLOSURE OF THE INVENTION

Technical Problem

The disclosure provides a solar cell and a method of fabricating the same, in which cells can be efficiently connected with each other through the precise patterning, a light absorption layer may have a wide surface area, and the efficiency of the solar cell can be improved.

The disclosure provides a solar cell and a method of fabricating the same, in which coupling strength between a substrate and a back electrode can be reinforced and the leakage current can be minimized.

Technical Solution

A solar cell according to the embodiment includes a plurality of back electrode patterns spaced apart from each other on a substrate; a light absorption layer including contact patterns to connect electrodes to each other and division patterns to divide cells into unit cells on the substrate formed with the back electrode patterns; top electrode patterns spaced apart from each other by the division patterns on the light absorption layer; and insulating patterns among the back electrode patterns or on the back electrode patterns, wherein the top electrode patterns are filled in the contact patterns and electrically connected to the back electrode patterns.

A method of fabricating a solar cell according to the embodiment includes forming a plurality of back electrode patterns spaced apart from each other on a substrate and forming insulating patterns among the back electrode patterns or on the back electrode patterns; forming a light absorption layer including contact patterns to connect electrodes to each other and division patterns to divide cells into unit cells on the substrate formed with the back electrode patterns; and forming top electrode patterns spaced apart from each other by the division patterns on the light absorption layer, wherein the top electrode patterns are filled in the contact patterns and electrically connected to the back electrode patterns.

Advantageous Effects

According to the solar cell and the method of fabricating the same of the first and second embodiments, first insulating patterns are formed on back electrode patterns, so that lower back electrode patterns can be prevented from being damaged.

In addition, the back electrode patterns are not exposed to the outside due to the first insulating patterns after the division patterns have been formed, so that the back electrode patterns can be prevented from being oxidized and can be protected from impurities.

In addition, since the cells are divided by a laser, a distance between adjacent cells can be reduced, a process can be simplified, and an area of a light incident region can be widened.

Further, the damage caused by the mechanical stress can be reduced, so that the efficiency of the solar cell can be improved.

According to the solar cell and the method of fabricating the same of the third embodiment, second insulating patterns are formed among the back electrode patterns, so that coupling strength between the back electrode patterns and the second insulating patterns can be reinforced.

That is, since the coupling strength between the back electrode patterns and the second insulating patterns can be reinforced, the back electrode patterns can be prevented from being delaminated from the substrate.

When the patterning process is performed by using a laser to form the back electrode patterns, an edge region of the back electrode patterns may be delaminated or peeled off. However, according to the embodiment, the back electrode patterns can be formed without using the laser, so that the back electrode patterns can be prevented from being deformed by the laser patterning.

In addition, since the back electrode patterns may not be delaminated, the light absorption layer can be stably formed, so that the quality and efficiency of the solar cell can be improved.

Further, since the second insulating patterns are formed among the back electrode patterns, the leakage current can be prevented from occurring among the back electrode patterns.

MODE FOR INVENTION

Figure 1:
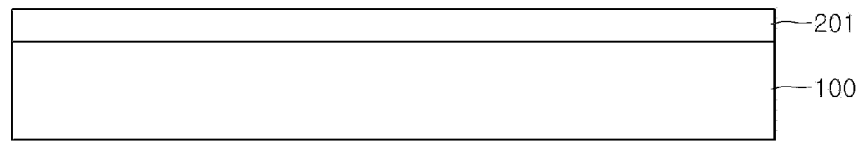
FIGS. 1 to 10 are sectional views showing a method of fabricating a solar cell according to the first embodiment.

In the description of the embodiments, it will be understood that, when a substrate, a film, an electrode, a groove or a layer is referred to as being "on" or "under" another substrate, another film, another electrode, another groove, or another layer, it can be "directly" or "indirectly" over the other substrate, film, electrode, groove, or layer, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

FIGS. 1 to 10 are sectional views showing a method of fabricating a solar cell according to the first embodiment.

As shown in FIG. 1, a back electrode 201 is formed on a substrate 100. The substrate 100 includes a glass substrate, a ceramic substrate, such as an alumina substrate, a stainless steel substrate, a titanium substrate or a polymer substrate.

The glass substrate may include soda lime glass and the polymer substrate may include polyimide.

The substrate 100 may be rigid or flexible.

The back electrode 201 may include a conductor such as a metal.

For instance, the back electrode 201 can be formed through a sputtering process by using a molybdenum (Mo) target.

The molybdenum (Mo) has high electric conductivity, superior ohmic contact property with respect to a light absorption layer and high temperature stability in the Se atmosphere.

In addition, although not shown in the drawings, the back electrode 201 may include at least one layer.

If the back electrode 201 includes a plurality of layers, the layers may be formed by using different materials.

Figure 2:
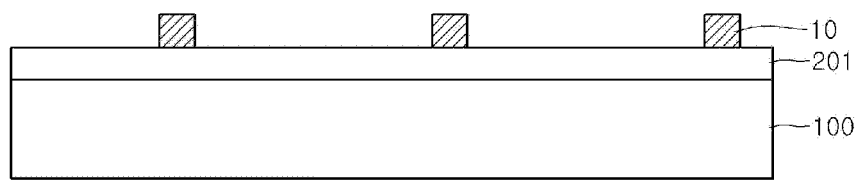

In addition, as shown in FIG. 2, a plurality of first insulating patterns 10 are formed on the back electrode 201.

In order to form the first insulating patterns 10, an insulating layer is formed on the back electrode 201 and a patterning process is performed with respect to the insulating layer.

The insulating layer can be formed through one of a sputtering process, a thermal deposition process, a spray process and a spin coating process.

The patterning process to form the first insulating patterns 10 may include a photolithography process such as a wet etching process or a dry etching process.

The first insulating patterns 10 may include an insulating material or a polymer compound, which does not react with the back electrode 201 and the light absorption layer to be formed later.

For instance, the first insulating patterns 10 may include one of $SiO_x$ (x=2 to 4), $SiN_x$ (x=4), PMMA (polymethyl methacrylate), polyimide, and polypropylene.

The first insulating patterns 10 are disposed among the cells to divide the cells from each other.

That is, each insulating pattern 10 is disposed between two adjacent cells by taking the position of the light absorption layer and the top electrode, which will be formed later, into consideration.

Figure 3:
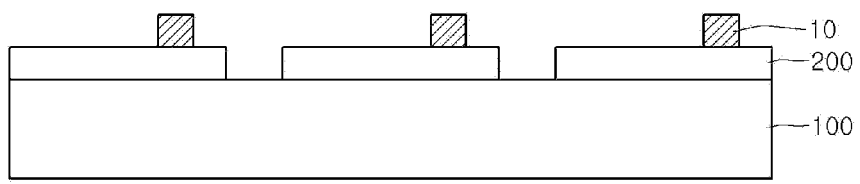

Then, as shown in FIG. 3, the patterning process is performed with respect to the back electrode 201 to form back electrode patterns 200.

The back electrode patterns 200 are aligned such that the substrate 100 can be exposed through the first insulating patterns 10.

In addition, the back electrode patterns 200 can be aligned in the form of a stripe or a matrix corresponding to the cells.

However, the back electrode patterns 200 may not be limited to the above shape, but may have various shapes.

Figure 4:
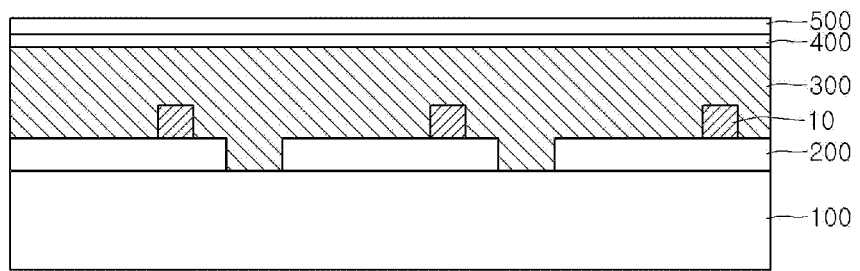

After that, as shown in FIG. 4, the light absorption layer 300, the first buffer layer 400 and the second buffer layer 500 are formed on the back electrode 201.

The light absorption layer 300 includes the Ib-IIIb-VIb group compound.

In detail, the light absorption layer 300 may include the Cu—In—Ga—Se ($Cu(In,Ga)Se_2$; CIGS) compound.

In contrast, the light absorption layer 300 may include the Cu—In—Se ($CuInSe_2$; CIS) compound or the Cu—Ga—Se ($CuGaSe_2$; CGS) compound.

For instance, in order to form the light absorption layer 300, a CIG metal precursor layer is formed on the back electrode 201 by using a Cu target, an In target or a Ga target.

The metal precursor layer reacts with Se through the selenization process, thereby forming the CIGS light absorption layer 300.

In addition, while the process for forming the metal precursor layer and the selenization process are being performed, alkali components contained in the substrate 100 are diffused into the metal precursor layer and the light absorption layer 300 through the back electrode patterns 200.

The alkali components may improve the grain size of the light absorption layer 300 and the crystal property.

The light absorption layer 300 receives the incident light to convert the incident light into the electric energy. The light absorption layer 300 generates the photo-electromotive force based on the photoelectric effect.

The first buffer layer 400 can be formed by depositing CdS on the light absorption layer 300.

The first buffer layer 400 is an N type semiconductor layer and the light absorption layer 300 is a P type semiconductor layer. Thus, the light absorption layer 300 and the first buffer layer 400 may form the PN junction.

In addition, the second buffer layer 500 may be prepared as a transparent electrode layer including one of ITO, ZnO and i-ZnO.

The first and second buffer layers 400 and 500 are disposed between the light absorption layer 300 and the top electrode to be formed later.

Since there is great difference in the lattice constant and the energy bandgap between the light absorption layer 300 and the top electrode, if the first and second buffer layers 400 and 500 having the intermediate bandgap are interposed between the light absorption layer 300 and the top electrode, the superior junction can be obtained.

According to the present embodiment, two buffer layers are formed on the light absorption layer 300. However, the embodiment is not limited thereto. For instance, only one buffer layer can be formed on the light absorption layer 300.

Figure 5:
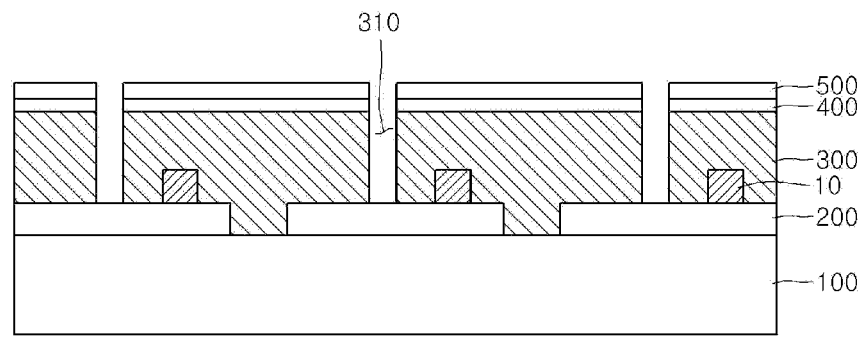

Then, as shown in FIG. 5, contact patterns 310 are formed through the light absorption layer 300, the first buffer layer 400 and the second buffer layer 500.

The contact patterns 310 can be formed through laser irradiation and the back electrode patterns 200 are partially exposed through the contact patterns 310.

At this time, the laser beam irradiated onto the second buffer layer 500 may have a wavelength different from a wavelength of the laser beam irradiated onto the light absorption layer 300 and the first buffer layer 400. In addition, the intensity of the laser beam can be adjusted through a lens.

Since the second buffer layer 500 has a high energy bandgap, a laser beam having relatively high output power is used for the second buffer layer 500. In addition, since the first buffer layer 400 and the light absorption layer 300 has a low energy bandgap, a laser beam having relatively low output power is used for the first buffer layer 400 and the light absorption layer 300 to form the contact patterns 310.

Figure 6:
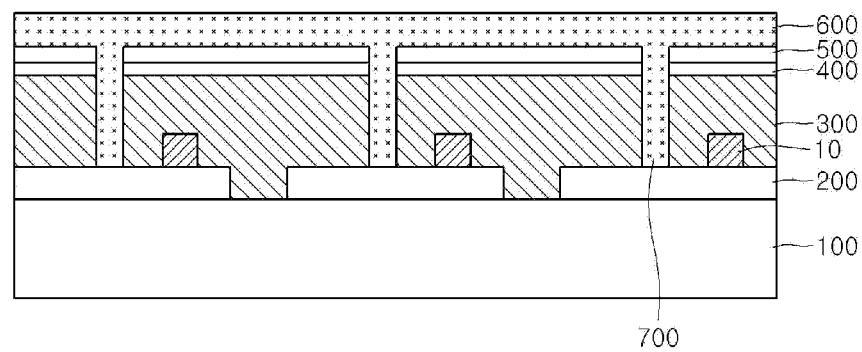

Then, as shown in FIG. 6, a transparent conductive material is deposited on the second buffer layer 500 to form a top electrode and a connection wire 700.

When the transparent conductive material is deposited on the second buffer layer 500, the transparent conductive material is filled in the contact patterns 310 to form the connection wire 700.

The back electrode patterns 200 are electrically connected to the top electrode 600 through the connection wire 700.

In order to form the top electrode 600, the sputtering process is performed with respect to the second buffer layer 500 by using aluminum-doped ZnO or alumina-doped ZnO.

The top electrode 600 is a window layer forming the PN junction with respect to the light absorption layer 300. Since the top electrode 600 serves as a transparent electrode for the solar cell, the top electrode 600 is formed by using ZnO having high light transmittance and superior electric conductivity.

In addition, ZnO is doped with aluminum or alumina, so that the top electrode 600 has a low resistance value.

In order to form the top electrode 600, a ZnO layer is deposited through the RF sputtering process using a ZnO target, the reactive sputtering using a Zn target, or the metal organic chemical vapor deposition (MOCVD).

In addition, a dual structure can be formed by depositing an ITO (indium tin oxide) layer having the superior electro-optical characteristic onto the ZnO layer.

Figure 7:
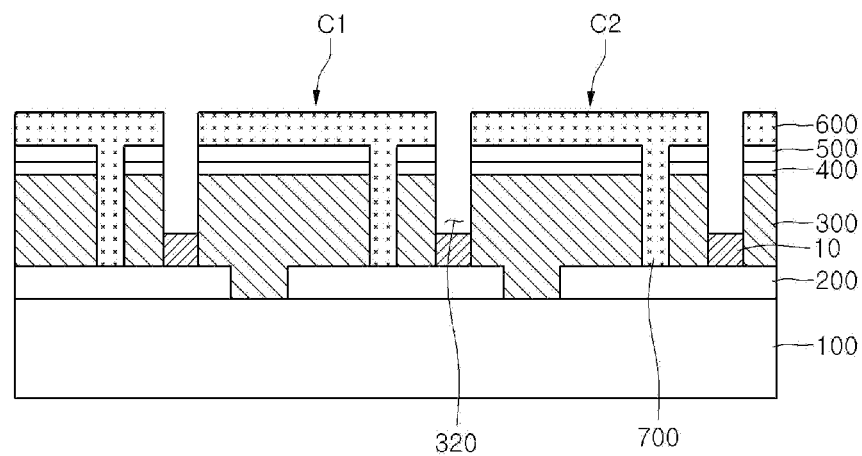

Then as shown in FIG. 7, division patterns 320 are formed through the light absorption layer 300, the first buffer layer 400 and the second buffer layer 500.

The division patterns 320 can be formed through the laser irradiation such that the top surface of the first insulating patterns 10 can be exposed through the division patterns 320.

The laser beam used to form the division patterns 320 has a wavelength of about 532 nm to about 1064 nm and power of about 5 W to about 20 W.

The first buffer layer 400, the second buffer layer 500 and the top electrode 600 are separated from each other by the division patterns 320. In addition, the cells C1 and C2 are separated from each other by the first insulating patterns 10 and the division patterns 320.

Since the first insulating patterns 10 are formed on the back electrode patterns 200, the lower back electrode patterns 200 can be prevented from being damaged when the laser patterning process is performed.

In addition, since the back electrode patterns 200 are not exposed to the outside due to the first insulating patterns 10 after the division patterns 320 has been formed, the back electrode patterns 200 can be prevented from being oxidized and can be protected from the impurities.

When the division patterns 320 are formed, the over etching is performed to electrically separate adjacent cells from each other, so the first insulating patterns 10 may be partially removed.

However, the first insulating patterns 10 may not be completely removed and the back electrode patterns 200 are not exposed.

According to the present embodiment, a width of the division patterns 320 is equal to a width of the first insulating patterns 10, but the embodiment is not limited thereto. For instance, the width of the division patterns 320 may be smaller than the width of the first insulating patterns 10.

Figure 8:
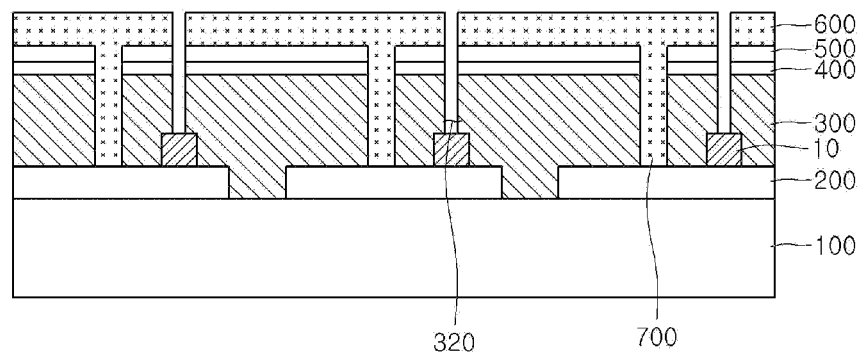

That is, as shown in FIG. 8, the division patterns 320 have a width sufficient for dividing the cells C1 and C2 from each other, and the width of the first insulating patterns 10 may be larger than the width of the division patterns 320.

Figure 9:
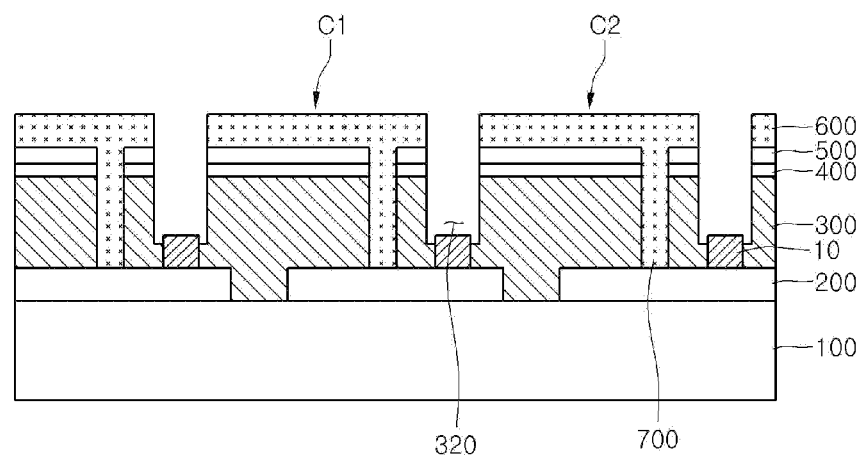

In addition, as shown in FIG. 9, the width of the division patterns 320 may be larger than the width of the first insulating patterns 10.

The first buffer layer 400, the second buffer layer 500, and the light absorption layer 300 may be aligned in the form of a stripe or a matrix by the division patterns 320.

However, the division patterns 320 may not be limited to the above shape, but may have various shapes.

The cells C1 and C2 including the back electrode patterns 200, the light absorption layer 300, the first buffer layer 400, the second buffer layer 500 and the top electrode 600 are formed by the division patterns 320. The cell C1 can be connected to the cell C2 by the connection wire 700. That is, the connection wire 700 electrically connects the back electrode patterns 200 of the second cell C2 with the top electrode 600 of the first cell C1 adjacent to the second cell C2.

Figure 10:
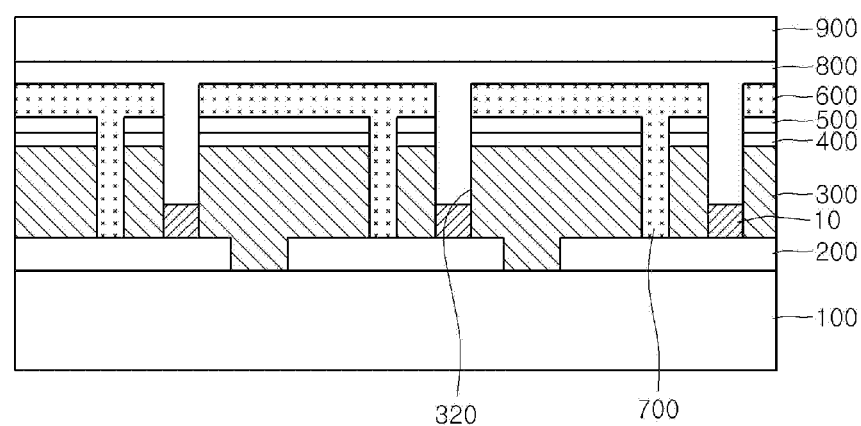

After that, as shown in FIG. 10, a transparent resin 800 and a top substrate 900 are formed on the top electrode 600.

The transparent resin 800 can be formed by performing the thermal process using EVA (ethylene vinyl acetate copolymer), and the top substrate 900 can be formed by using heat strengthened glass. The transparent resin 800 is filled in the division patterns 320 so that the stack structure of the first insulating patterns 10 and the transparent resin 800 can be formed on the division patterns 320.

FIGS. 11 to 14 are sectional views showing a method of fabricating a solar cell according to the second embodiment. In the following description of the second embodiment, the elements and structures the same as those of the first embodiment will be depicted with the same reference numerals and detailed description thereof will be omitted in order to avoid redundancy.

Figure 11:
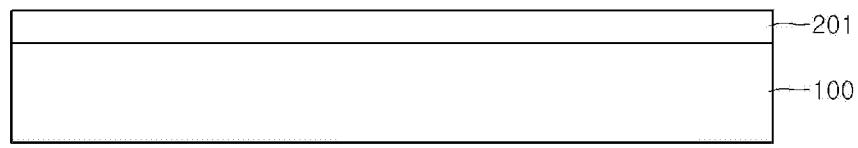
FIGS. 11 to 14 are sectional views showing a method of fabricating a solar cell according to the second embodiment.

As shown in FIG. 11, a back electrode 201 is formed on a substrate 100.

The substrate 100 includes a glass substrate, a ceramic substrate, such as an alumina substrate, a stainless steel substrate, a titanium substrate or a polymer substrate.

The back electrode 201 may include a conductor such as a metal.

Although not shown in the drawings, the back electrode 201 may include at least one layer.

Figure 12:
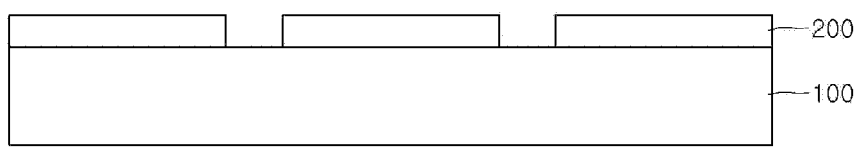

In addition, as shown in FIG. 12, a patterning process is performed with respect to the back electrode 201 to form back electrode patterns 200.

The back electrode patterns 200 may expose the substrate 100.

The back electrode patterns 200 can be aligned in the form of a stripe or a matrix corresponding to the cells.

Figure 13:
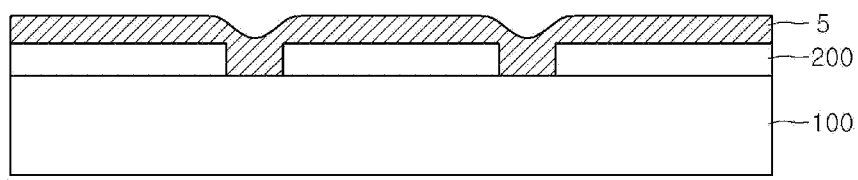

Then, as shown in FIG. 13, an insulating layer 5 is formed on the substrate 100 having the back electrode patterns 200.

The insulating layer 5 can be formed through one of a sputtering process, a thermal deposition process, a spray process and a spin coating process.

The insulating layer 5 may include an insulating material or a polymer compound, which does not react with the back electrode 201 and the light absorption layer to be formed later.

For instance, the insulating layer 5 may include one of $SiO_x$ (x=2 to 4), $SiN_x$ (x=4), PMMA (polymethyl methacrylate), polyimide, and polypropylene.

Figure 14:
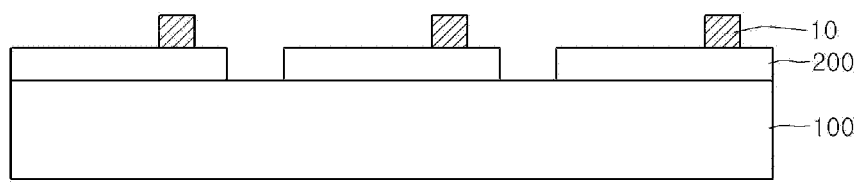

After that, as shown in FIG. 14, a plurality of first insulating patterns 10 are formed on the back electrode patterns 200.

The first insulating patterns 10 may be formed by performing a photolithography process such as a wet etching process or a dry etching process with respect to the insulating layer 5 formed on the back electrode patterns 200.

The first insulating patterns 10 can be disposed among the cells to divide the cells from each other.

That is, each insulating pattern 10 is disposed between two adjacent cells by taking the position of the light absorption layer and the top electrode, which will be formed later, into consideration.

The process to form the light absorption layer 300 and the top electrode 600 on the first insulating patterns 10 is identical to the process shown in FIGS. 4 to 10, so the detailed description thereof will be omitted in order to avoid redundancy.

According to the solar cell and the method of fabricating the same of the first and second embodiments, the first insulating patterns are formed on the back electrode patterns, so the lower back electrode patterns can be prevented from being damaged when the laser patterning process is performed to divide the cells.

In addition, the back electrode patterns are not exposed to the outside due to the first insulating patterns after the division patterns have been formed, so that the back electrode patterns can be prevented from being oxidized and can be protected from impurities.

Further, since the cells are divided by a laser, a distance between adjacent cells can be reduced, a process can be simplified, and an area of a light incident region can be widened.

In addition, the damage caused by the mechanical stress can be reduced, so that the efficiency of the solar cell can be improved.

FIGS. 15 to 22 are sectional views showing a method of fabricating a solar cell according to the third embodiment.

Figure 15:
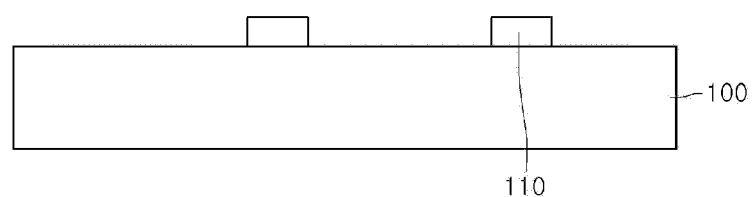
FIGS. 15 to 23 are sectional views showing a method of fabricating a solar cell according to the third embodiment.

As shown in FIG. 15, second insulating patterns 110 are formed on a substrate 100. The substrate 100 includes a glass substrate, a ceramic substrate, such as an alumina substrate, a stainless steel substrate, a titanium substrate or a polymer substrate.

The glass substrate may include soda lime glass.

The substrate 100 may be rigid or flexible.

In order to form the second insulating patterns 110, an insulating layer (not shown) is formed on the substrate 100 and the patterning process is performed with respect to the insulating layer. The substrate 100 can be exposed through the second insulating patterns 110.

The insulating layer may be formed by using photoresist. In detail, the photolithography process is performed with respect to the photoresist to form the second insulating patterns 110.

The second insulating patterns 110 can be formed through various methods. For instance, the photoresist or the insulating material can be formed on the substrate 100 through the screen printing scheme, the inkjet printing scheme or the gravure printing scheme.

In addition, the photolithography process can be directly performed with respect to the substrate 100 to partially remove the substrate 100, thereby forming the second insulating patterns 110.

The second insulating patterns 110 are formed by using the material the same as that of the substrate 100. In detail, the second insulating patterns 110 may include the photoresist or the insulating material.

The second insulating patterns 110 are aligned among the back electrode patterns by taking the position of the back electrode patterns into consideration.

Figure 16:
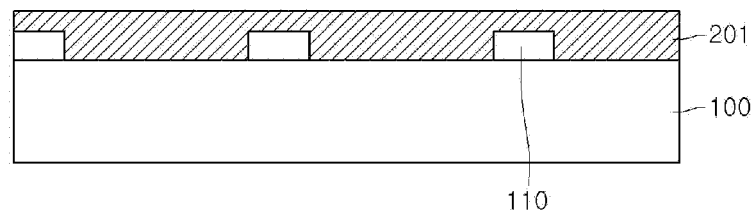

Then, as shown in FIG. 16, the back electrode layer 201 is formed on the substrate 100 having the second insulating patterns 110.

The back electrode layer 201 may include a conductor such as a metal.

For instance, the back electrode layer 201 can be formed through a sputtering process by using a molybdenum (Mo) target.

The molybdenum (Mo) has high electric conductivity, superior ohmic contact property with respect to a light absorption layer and high temperature stability in the Se atmosphere.

In addition, although not shown in the drawings, the back electrode layer 201 may include at least one layer.

If the back electrode layer 201 includes a plurality of layers, the layers may be formed by using different materials.

Figure 17:
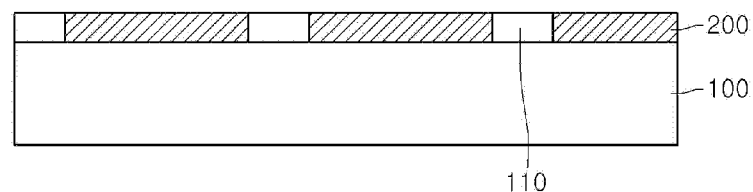

After that, as shown in FIG. 17, the back electrode patterns 200 are formed among the second insulating patterns 110 on the substrate 100.

The back electrode patterns 200 can be formed by partially removing the back electrode layer 201 such that the second insulating patterns 110 can be exposed.

At this time, the back electrode layer 201 can be partially removed through one of the chemical mechanical polishing (CMP) process, the wet etching process, the dry etching process and the sand blast process.

The height of the second insulating patterns 110 is equal to the height of the back electrode patterns 200.

That is, the top surface of the second insulating patterns 110 is aligned on the same plane with the top surface of the back electrode patterns 200.

However, the height of the second insulating patterns 110 and the back electrode patterns 200 may not be limited to the above. For instance, the height of the back electrode patterns 200 may be lower than the height of the second insulating patterns 110.

In detail, when the back electrode layer 201 is partially removed to expose the second insulating patterns 110, the back electrode layer 201 is over-etched such that the height of the back electrode patterns 200 may be lower than the height of the second insulating patterns 110.

Since the second insulating patterns 110 are aligned among the back electrode patterns 200, the coupling strength between the back electrode patterns 200 and the second insulating patterns 110 can be reinforced.

That is, since the coupling strength between the back electrode patterns 200 and the second insulating patterns 110 can be reinforced, the back electrode patterns 200 can be prevented from being delaminated from the substrate 100.

In addition, the second insulating patterns 110 may have a width smaller than a width of the back electrode patterns 200.

In addition, the back electrode patterns 200 may be aligned in the form of a stripe or a matrix corresponding to the cells.

However, the back electrode patterns 200 may not be limited to the above shape, but may have various shapes.

In addition, after the second insulating patterns 110 have been formed, the back electrode patterns 200 are formed among the second insulating patterns 110, so the additional patterning process for the back electrode patterns 200 may not be necessary.

When the patterning process is performed by using a laser to form the back electrode patterns 200, an edge region of the back electrode patterns may be delaminated or peeled off. However, according to the embodiment, the back electrode patterns can be formed without using the laser, so that the back electrode patterns 200 can be prevented from being deformed by the laser patterning.

Since the back electrode patterns 200 are not delaminated, the light absorption layer can be stably formed in the subsequent process, so that the quality and the efficiency of the solar cell can be improved.

In addition, although not shown in the drawings, the second insulating patterns 110 may be removed after the back electrode patterns 200 have been formed.

The method of forming the back electrode patterns 200 on the substrate 100 may not be limited to the above method.

Figure 18:
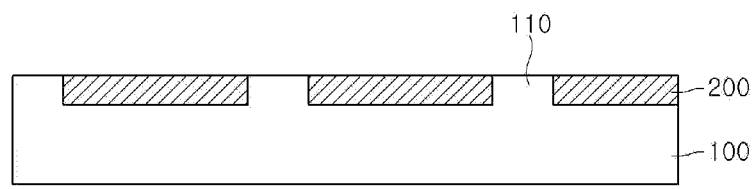

For instance, as shown in FIG. 18, the substrate 100 is partially removed to form the second insulating patterns 110 extending from the substrate 100 and the back electrode patterns 200 are formed among the second insulating patterns 110.

At this time, the second insulating patterns 110 and the substrate 100 are formed by using the same material.

Figure 19:
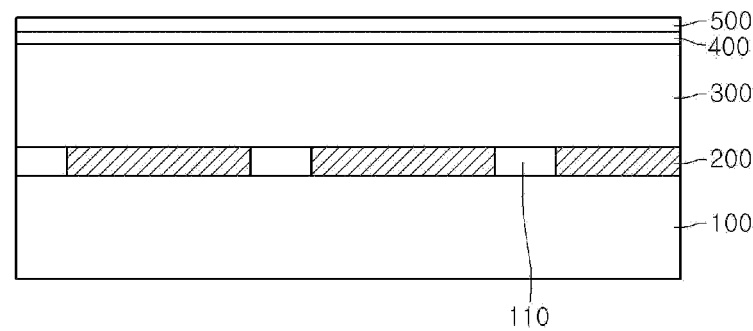

After that, as shown in FIG. 19, the light absorption layer 300, the first buffer layer 400 and the second buffer layer 500 are formed on the substrate 100 having the back electrode patterns 200 and the second insulating patterns 110.

The light absorption layer 300 includes the Ib-IIIb-VIb group compound.

In detail, the light absorption layer 300 may include the Cu—In—Ga—Se ($Cu(In,Ga)Se_2$; CIGS) compound.

In contrast, the light absorption layer 300 may include the Cu—In—Se ($CuInSe_2$; CIS) compound or the Cu—Ga—Se ($CuGaSe_2$; CGS) compound.

For instance, in order to form the light absorption layer 300, a CIG metal precursor layer is formed on the back electrode 201 by using a Cu target, an In target or a Ga target.

The metal precursor layer reacts with Se through the selenization process, thereby forming the CIGS light absorption layer 300.

In addition, while the process for forming the metal precursor layer and the selenization process are being performed, alkali components contained in the substrate 100 are diffused into the metal precursor layer and the light absorption layer 300 through the back electrode patterns 200.

The alkali components may improve the grain size of the light absorption layer 300 and the crystal property.

The light absorption layer 300 receives the incident light to convert the incident light into the electric energy. The light absorption layer 300 generates the photo-electromotive force based on the photoelectric effect.

At this time, since the second insulating patterns 110 are formed among the back electrode patterns 200, the leakage current can be prevented from occurring among the back electrode patterns 200.

The first buffer layer 400 can be formed by depositing CdS on the light absorption layer 300.

The first buffer layer 400 is an N type semiconductor layer and the light absorption layer 300 is a P type semiconductor layer. Thus, the light absorption layer 300 and the first buffer layer 400 may form the PN junction.

In addition, the second buffer layer 500 can be formed by performing the sputtering process using the ZnO target.

The first and second buffer layers 400 and 500 are disposed between the light absorption layer 300 and the top electrode to be formed later.

Since there is great difference in the lattice constant and the energy bandgap between the light absorption layer 300 and the top electrode, if the first and second buffer layers 400 and 500 having the intermediate bandgap are interposed between the light absorption layer 300 and the top electrode, the superior junction can be obtained.

Figure 20:
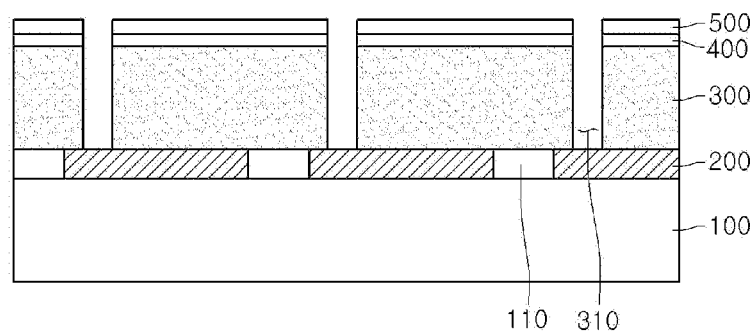

Then, as shown in FIG. 20, contact patterns 310 are formed through the light absorption layer 300, the first buffer layer 400 and the second buffer layer 500.

The contact patterns 310 can be formed through the mechanical patterning or the laser irradiation.

The back electrode patterns 200 are partially exposed through the contact patterns 310.

Figure 21:
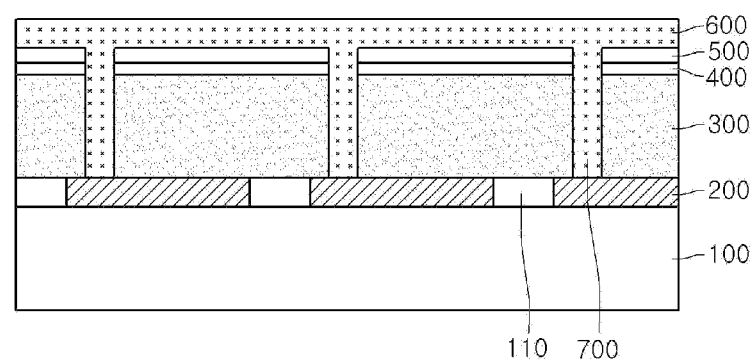

After that, as shown in FIG. 21, a transparent conductive material is deposited on the second buffer layer 500 to form a top electrode and a connection wire 700.

When the transparent conductive material is deposited on the second buffer layer 500, the transparent conductive material is filled in the contact patterns 310 to form the connection wire 700.

The back electrode patterns 200 are electrically connected to the top electrode 600 through the connection wire 700.

In order to form the top electrode 600, the sputtering process is performed with respect to the second buffer layer 500 by using aluminum-doped ZnO or alumina-doped ZnO.

The top electrode 600 is a window layer forming the PN junction with respect to the light absorption layer 300. Since the top electrode 600 serves as a transparent electrode for the solar cell, the top electrode 600 is formed by using ZnO having high light transmittance and superior electric conductivity.

In addition, ZnO is doped with aluminum or alumina, so that the top electrode 600 has a low resistance value.

In order to form the top electrode 600, a ZnO layer is deposited through the RF sputtering process using a ZnO target, the reactive sputtering using a Zn target, or the metal organic chemical vapor deposition (MOCVD).

In addition, a dual structure can be formed by depositing an ITO (indium tin oxide) layer having the superior electro-optical characteristic onto the ZnO layer.

Figure 22:
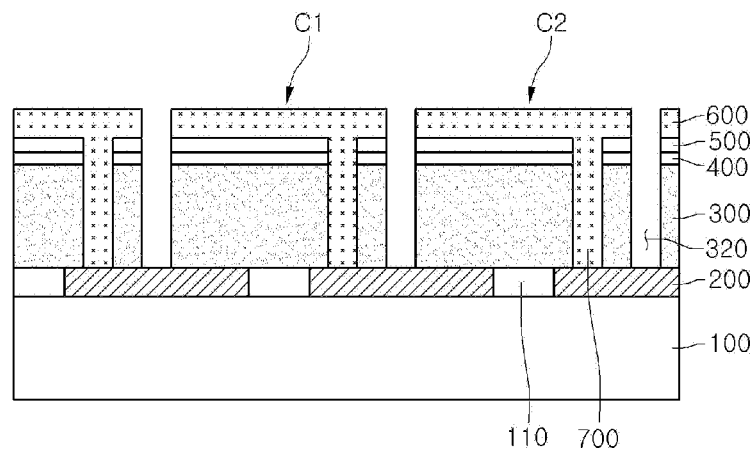

Then as shown in FIG. 22, division patterns 320 are formed through the light absorption layer 300, the first buffer layer 400 and the second buffer layer 500.

That is, the division patterns 320 can be formed through the top electrode 600, the light absorption layer 300, the first buffer layer 400 and the second buffer layer 500.

In addition, the division patterns 320 can be formed through the mechanical patterning or the laser irradiation.

The back electrode patterns 200 are partially exposed through the division patterns 320.

The first buffer layer 400, the second buffer layer 500 and the top electrode 600 are separated from each other by the division patterns 320. In addition, the cells C1 and C2 are separated from each other by the division patterns 320.

The first buffer layer 400, the second buffer layer 500 and the light absorption layer 300 are aligned in the form of a stripe or a matrix by the division patterns 320.

The division patterns 320 may not be limited to the above shape, but may have various shapes.

The cells C1 and C2 including the back electrode patterns 200, the light absorption layer 300, the first buffer layer 400, the second buffer layer 500 and the top electrode 600 are formed by the division patterns 320. The cell C1 can be connected to the cell C2 by the connection wire 700. That is, the connection wire 700 electrically connects the back electrode patterns 200 of the second cell C2 with the top electrode 600 of the first cell C1 adjacent to the second cell C2.

Figure 23:
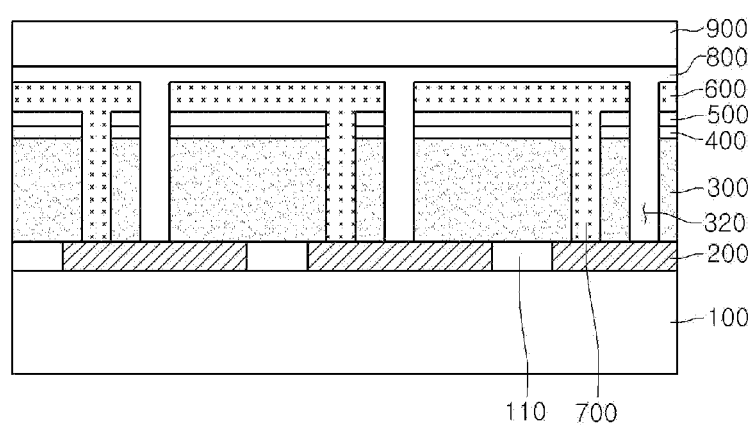

After that, as shown in FIG. 23, a transparent resin 800 and a top substrate 900 are formed on the top electrode 600.

The transparent resin 800 can be formed by performing the thermal process using EVA (ethylene vinyl acetate copolymer), and the top substrate 900 can be formed by using heat strengthened glass.

As described above, according to the solar cell and the method of fabricating the same of the third embodiment, second insulating patterns are formed among the back electrode patterns, so that coupling strength between the back electrode patterns and the second insulating patterns can be reinforced.

That is, since the coupling strength between the back electrode patterns and the second insulating patterns can be reinforced, the back electrode patterns can be prevented from being delaminated from the substrate.

When the patterning process is performed by using a laser to form the back electrode patterns, an edge region of the back electrode patterns may be delaminated or peeled off. However, according to the embodiment, the back electrode patterns can be formed without using the laser, so that the back electrode patterns can be prevented from being deformed by the laser patterning.

In addition, since the back electrode patterns may not be delaminated, the light absorption layer can be stably formed, so that the quality and efficiency of the solar cell can be improved.

Further, since the second insulating patterns are formed among the back electrode patterns, the leakage current can be prevented from occurring among the back electrode patterns.

What is claimed is:

1. A solar cell apparatus comprising:
a plurality of back electrodes spaced apart from each other on a substrate;
a light absorption layer including division gaps to divide cells into a plurality of unit cells on the substrate formed with the back electrodes;
top electrodes spaced apart from each other by the entire division gaps on the light absorption layer;
a buffer layer interposed between the light absorption layer and the top electrodes and comprising a first buffer layer and a second buffer layer;
an insulator comprising an insulating pattern of an insulating material disposed on the back electrodes, wherein the insulator is disposed only on top surfaces of the back electrodes;
a transparent resin filled in the division gaps and stacked on the insulator; and
a top substrate disposed on the transparent resin;
wherein the light absorption layer, the first buffer layer, and the second buffer layer comprise a plurality of contact gaps;
wherein the top electrodes are filled in the contact gaps and electrically connected to the back electrodes and comprise ZnO doped with aluminum or alumina,
wherein an upper surface of the insulator is lower than an upper surface of the light absorption layer,
wherein the upper surface of the insulator is the surface of the insulator farthest away from the substrate, and the upper surface of the light absorption layer is the surface of the light absorption layer farthest away from the substrate;
wherein the first buffer layer forms a P/N junction with the light absorption layer,
wherein the first buffer layer has an energy bandgap lower than an energy bandgap of the second buffer layer,
wherein each unit cell includes a contact gap of the plurality of contact gaps,
wherein, within each unit cell, a portion of the light absorption layer is disposed between the contact gap and an adjacent division gap, in a first direction parallel to a top surface of the substrate;
wherein each division gap has a width larger than a width of the insulator,
wherein a lower surface of the division gap is lower than the upper surface of the insulator,
wherein the top electrodes filled in the contact gaps are in direct physical contact with the first and second buffer layers, and
wherein the transparent resin filled in the division gaps is in direct physical contact with the first and second buffer layers.

2. The solar cell apparatus of claim 1, wherein a shortest distance between the top electrode of a given unit cell and the top electrode of an adjacent unit cell, taken in the first direction, is the same as a shortest distance between the light absorption layer of a given unit cell and the light absorption layer of an adjacent unit cell, taken in the first direction.

3. The solar cell apparatus of claim 1, wherein the light absorption layer is disposed between the front electrode layer and the insulator such that the front electrode layer is completely physically separated from the insulator.

4. The solar cell of claim 1, wherein the insulator is disposed on the back electrodes within the division gaps.

5. The solar cell of claim 1, wherein the insulator includes one of SiOx (x=2 to 4), SiNx (x=4), PMMA (polymethyl methacrylate), polyimide, and polypropylene.

6. The solar cell of claim 1, wherein a thickness of the insulator is smaller than a thickness of the light absorption layer.

7. The solar cell of claim 1, wherein a thickness of the back electrodes is equal to a thickness of the insulator.

8. The solar cell of claim 1, wherein a thickness of the back electrodes is smaller than a thickness of the insulator.

9. The solar cell of claim 1, wherein the insulator and the substrate are formed by using a same material.

* * * * *